United States Patent [19]

Lindberg et al.

[11] 4,134,632
[45] Jan. 16, 1979

[54] ATTACHING MEANS FOR CIRCUIT CARD CONNECTORS

[75] Inventors: Fritz J. Lindberg, Stockholm; Uno S. Nilsson, Hägersten, both of Sweden

[73] Assignee: Telefonaktiebolaget L M Ericsson, Stockholm, Sweden

[21] Appl. No.: 825,569

[22] Filed: Aug. 18, 1977

[30] Foreign Application Priority Data

Sep. 7, 1976 [SE] Sweden .............................. 7609843

[51] Int. Cl.² ............................................. H05K 1/12
[52] U.S. Cl. ........................... 339/17 LC; 339/125 R; 339/176 MP; 361/399
[58] Field of Search ............ 339/17 L, 17 LM, 17 M, 339/176 MP, 75 MP, 91 R, 125 R; 361/399, 413, 415

[56] References Cited

U.S. PATENT DOCUMENTS 3,822,416  7/1974  Haag et al. ............... 339/176 MP X

OTHER PUBLICATIONS

"Circon Application Notes," Advertisement, Circon Component Co., Northridge, Cal., 11-1954.

*Primary Examiner*—Roy Lake
*Assistant Examiner*—E. F. Desmond
*Attorney, Agent, or Firm*—Hane, Roberts, Spiecens & Cohen

[57] ABSTRACT

In order to fix the position of two printed wiring connectors located on the same circuit board an attaching bar is used. This bar is laid over the connectors and is provided with positioning pins adapted to engage the attachment holes of the connectors. The bar is provided with mounting studs having mounting holes at some distance from the edge of the card so that corresponding holes in the card will not weaken the edge.

5 Claims, 1 Drawing Figure

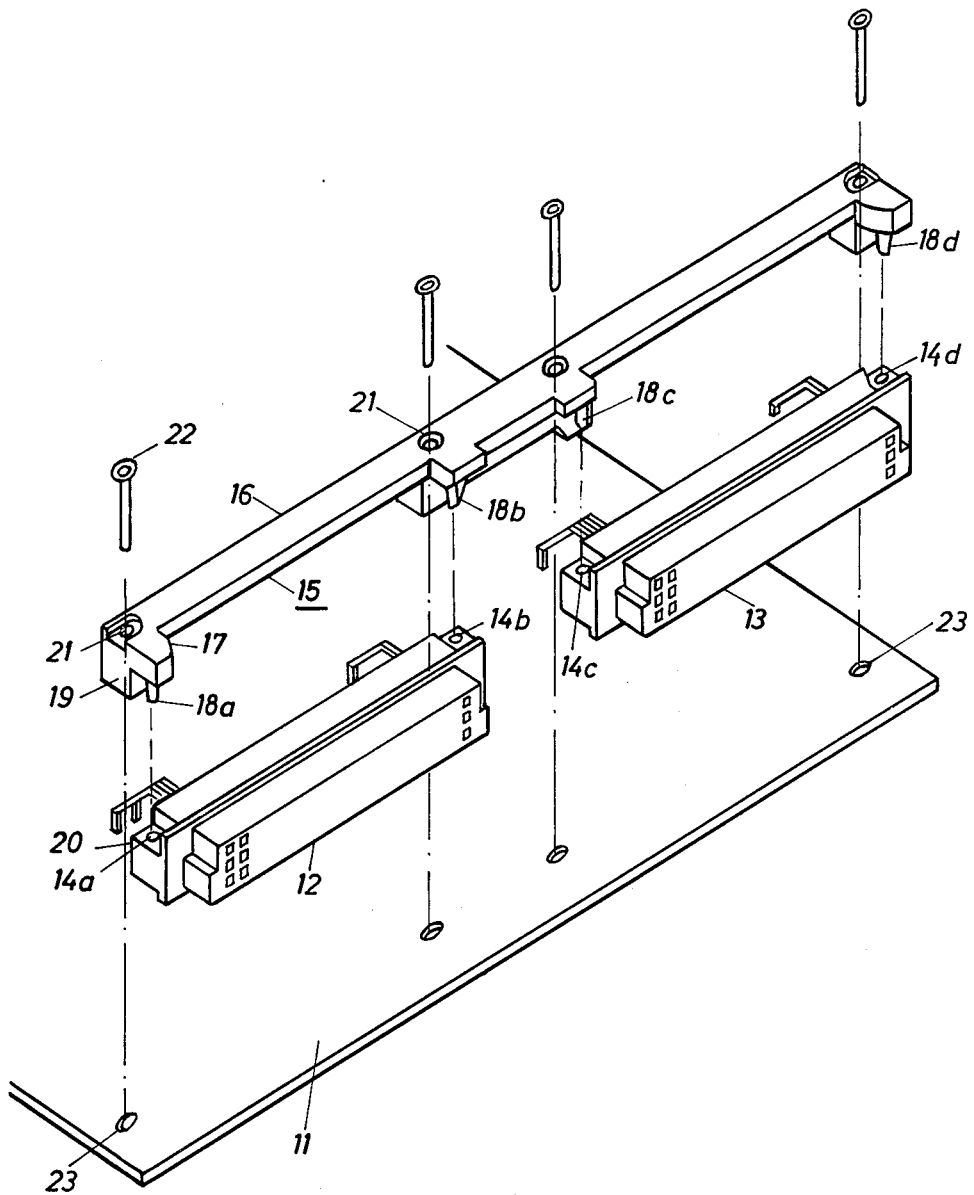

4,134,632

ATTACHING MEANS FOR CIRCUIT CARD CONNECTORS

FIELD OF THE INVENTION

The present invention relates to an attaching means for connectors mounted on circuit cards.

BACKGROUND

A common method to connect the conductor pattern on a circuit card to outside circuits is by means of two part connectors, one half of which is mounted close to an edge of the circuit card while the other half is mounted in a frame or an apparatus cabinet.

In earlier known arrangements of this kind, the connector is fixed to the circuit card by means of mounting hardware (screws, rivets) which pass through mounting holes in the connector and through corresponding holes in the circuit card. The holes which have to be made in the circuit card will often be placed too close to the edge of the card in the connectors which are common today. Therefore there is a considerable risk that the card will break or splinter. Besides, the punchings close to the edge of the circuit card act as kerfs. As the required force for pushing the circuit card into the connector as well as for pulling it out again is considerable, fractures arise very easily. Also dynamic strains arising for example during transport involve a considerable risk of damage to the attaching means of the connectors of the card.

It is very common to place two connectors side by side on a large-sized circuit card. These connectors mate with connectors which are fixed in a frame. Due to the characteristics of the material the tolerances when punching circuit cards are so great that it is difficult to obtain the required precision in the distance between the two connector halves which are fixed on the circuit card. This may cause contact pins to be damaged due to deficient fitting.

SUMMARY OF THE INVENTION

Both these disadvantages can be avoided by means of an attaching means according to the invention the characteristics of which appear from the appended claims.

It is contemplated by the invention that a particular means be employed for mounting the connectors in precise spaced relation at the edge of the circuit card, said means comprising an elongated bar overlying the connectors and securing the connectors in the precise spaced relation at the edge of the circuit card. The bar includes four positioning pins at precise spacing engaged in respective pairs of mounting holes in the connectors to hold the connectors in the precise spaced relation. The bar further includes heads positioned behind the connectors at the back surfaces thereof remote from the edge of the circuit card. The heads are provided with holes and attachment means, such as rivets or the like, are passed through the holes in the heads of the bar and are engaged with the circuit card without passing through the connectors.

The positioning of the heads at the back surfaces of the connectors locates the attachment means behind the connectors and further from the edge then said connectors are from said edge.

BRIEF DESCRIPTION OF THE DRAWING

The invention will be described in detail in connection to the appended drawing the sole FIGURE of which shows an exploded view of an attaching means with matching connectors and circuit card.

DETAILED DESCRIPTION

In the drawing, numeral 11 designates a circuit card onto which two connectors 12 and 13 are to be mounted. The connectors are, as usual, provided with mounting holes 14a-d. When mounting the connectors 12, 13 onto the circuit card 11 in a conventional way, attaching means, for example rivets, should have been passed through these holes 14a-d and through corresponding holes in the circuit card. Due to inevitable tolerances in the attaching means and the holes there is uncertainty in the distance between the two connectors. Therefore, in the design shown the holes 14a-d are instead used for centering the two connectors by means of a mounting member 15. The member 15 has the shape of a bar 16 which is provided with projections 17. On these projections there are positioning pins 18a-d. These positioning pins are dimensioned in such a way that they fit into the attachment holes 14a-d of the connectors. The distance between the positioning pins 18a and 18c is very carefully adjusted whereby the distance from a given contact element in one connector to a corresponding contact element in the other connector will be well defined. The positioning pins 18b and 18c can be somewhat conical in order to compensate for tolerances in the diameter of the holes 14b and 14e. The positioning pins 18a and 18c are shaped in such a way that the tolerances which exist in the distance between the attachment holes in a connector, for example 14a and 14b, are met. Therefore, these positioning pins have a smaller dimension in the longitudinal direction of the mounting member 15 than the positioning pins 18b and 18c.

The mounting member 15 is provided with heads 19 which, when the mounting member has been mounted on the connector, fits against the backside 20 thereof. The connector assembly 12, 13, 15 is fixed to the circuit card, for example, by installing rivets 22 through the holes 21 in the heads 19 and through corresponding holes 23 in the circuit card. The fact that the heads 19 are placed behind the connectors 12, 13 makes it possible to place the holes 23 in the circuit card 11 further away from the edge than would have been possible otherwise. Furthermore it is not necessary to drill the holes with great accuracy and they do not need to have small diameter tolerances as a certain lateral displacement of the contact assembly 12, 13, 15 relative to the card can easily be compensated as the circuit card is positioned by card guides which admit a certain lateral movement. The matching between the halves of the connectors is effectuated by means of guide means being placed on these and as the distance between the two connectors on the circuit card once has been carefully determined by the mounting member there is no risk that a connector will be damaged due to an incorrect position.

The cross section profile of the bar 15 is suitably shaped in such a way that it also helps to stiffen the card whereby extra stiffening details which are often found on large circuit cards can be avoided. The attaching means is suitably made of a plastic material which is suitable from the point of view of strength and said plastic material can, if necessary, be fibre reinforced. It may also be suitable to include a stiffening metal bar.

We claim:

1. The combination of two connectors having respective contact elements, a circuit card having an edge and means for mounting the connectors in precise spaced relation at the edge of said circuit card, said connectors each having a pair of spaced mounting holes, said means comprising an elongated bar overlying the connectors, said bar including four positioning pins at precise spacing engaged in respective pairs of mounting holes in said connectors to hold said connectors in said precise spaced relation, said bar further including heads positioned behind said connectors at the back surfaces thereof remote from the edge of the circuit card, said heads being provided with holes, and attachment means passing through the holes in said heads of the bar and engaged with said circuit card without passing through said connectors.

2. The combination as claimed in claim 1 wherein said heads abut against the back surfaces of the connectors and extend into contact with the circuit card.

3. The combination as claimed in claim 1 wherein two of said positioning pins engaged in respective holes of said connectors have close tolerances whereas the other two positioning pins engaged in respective holes of the connectors have loose tolerances.

4. The combination as claimed in claim 3 wherein the pins with close tolerances are conical in shape.

5. The combination as claimed in claim 1 wherein the positioning of said heads at the back surfaces of the connectors locates said attachment means behind said connectors and further from said edge than said connectors are from said edge.

* * * * *